United States Patent
Chen

(10) Patent No.: US 11,791,012 B2
(45) Date of Patent: *Oct. 17, 2023

(54) STANDBY CIRCUIT DISPATCH METHOD, APPARATUS, DEVICE AND MEDIUM

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/515,776

(22) Filed: Nov. 1, 2021

(65) Prior Publication Data

US 2022/0319628 A1 Oct. 6, 2022

Related U.S. Application Data

(63) Continuation of application No. PCT/CN2021/109515, filed on Jul. 30, 2021.

(30) Foreign Application Priority Data

Mar. 31, 2021 (CN) .......................... 202110352499.2

(51) Int. Cl.
  *G11C 29/44* (2006.01)
  *G11C 29/46* (2006.01)
  (Continued)

(52) U.S. Cl.
  CPC .............. *G11C 29/46* (2013.01); *G11C 29/10* (2013.01); *G11C 29/4401* (2013.01); *G11C 29/785* (2013.01); *G11C 2029/1202* (2013.01)

(58) Field of Classification Search
  CPC ..................................................... G11C 29/46
  See application file for complete search history.

(56) References Cited

U.S. PATENT DOCUMENTS 6,067,259 A   5/2000   Handa
6,535,993 B1  3/2003   Hamada
(Continued)

FOREIGN PATENT DOCUMENTS

CN   1195814 A   10/1998
CN   1366308 A   8/2002
(Continued)

OTHER PUBLICATIONS

International Search Report in the international application No. PCT/CN2021/099159, dated Sep. 8, 2021, 2 pgs.
(Continued)

*Primary Examiner* — Min Huang
(74) *Attorney, Agent, or Firm* — Cooper Legal Group, LLC

(57) ABSTRACT

Provided are standby circuit dispatch method, apparatus, device and medium. The method includes: a first test item is executed and first test data is acquired, the first test data including position data of a failure bit acquired during execution of the first test item; a first redundant circuit dispatch result is determined according to the first test data; a second test item is executed and second test data is acquired; when the failure bit acquired during execution of the second test item includes a failure bit outside the repair range of the dispatched regional redundant circuits and dispatched global redundant circuits, and the dispatchable redundant circuits have been dispatched out, a maximum target bit umber is acquired according to the first test data and the second test data; and a target dispatch mode is selected and a second redundant circuit dispatch result is determined according to the target dispatch mode.

19 Claims, 11 Drawing Sheets

(51) Int. Cl.
  *G11C 29/00* (2006.01)
  *G11C 29/10* (2006.01)
  *G11C 29/12* (2006.01)

(56) References Cited

U.S. PATENT DOCUMENTS

| | | | |
|---|---|---|---|
| 6,741,509 | B2 | 5/2004 | Kato |
| 6,876,588 | B2 | 4/2005 | Kato |
| 7,079,432 | B2 | 7/2006 | Kato |
| 7,127,647 | B1 | 10/2006 | Zorian |
| 7,224,596 | B2 | 5/2007 | Jeong |
| 10,446,253 | B2 | 10/2019 | Choi |
| 2001/0009521 | A1 | 7/2001 | Hidaka |
| 2001/0026486 | A1 | 10/2001 | Ogawa |
| 2002/0001896 | A1 | 1/2002 | Yoon |
| 2002/0114198 | A1 | 8/2002 | Kato |
| 2002/0191454 | A1 | 12/2002 | Beer |
| 2003/0164510 | A1 | 9/2003 | Dono |
| 2003/0191991 | A1 | 10/2003 | Hsu |
| 2004/0062134 | A1 | 4/2004 | Kato |
| 2004/0210803 | A1 | 10/2004 | Cheng |
| 2005/0039073 | A1 | 2/2005 | Hartmann |
| 2005/0122802 | A1 | 6/2005 | Kato |
| 2006/0090058 | A1 | 4/2006 | Chng |
| 2006/0098503 | A1 | 5/2006 | Jeong |
| 2007/0247937 | A1 | 10/2007 | Moriyama |
| 2009/0119537 | A1 | 5/2009 | Lee |
| 2009/0316469 | A1 | 12/2009 | Rodriguez |
| 2009/0319839 | A1 | 12/2009 | Surulivel |
| 2010/0157656 | A1 | 6/2010 | Tsuchida |
| 2010/0169705 | A1* | 7/2010 | Fujii ............ G11C 29/72  714/719 |
| 2010/0290299 | A1 | 11/2010 | Matsumoto |
| 2010/0322024 | A1 | 12/2010 | Yagishita |
| 2011/0002169 | A1 | 1/2011 | Li |
| 2011/0090751 | A1 | 4/2011 | Manna |
| 2011/0199845 | A1 | 8/2011 | Yang |
| 2012/0173932 | A1 | 7/2012 | Li |
| 2012/0206973 | A1 | 8/2012 | He |
| 2012/0257467 | A1* | 10/2012 | Kosugi ............ G11C 29/56008  365/200 |
| 2012/0275249 | A1 | 11/2012 | Yang |
| 2012/0297245 | A1 | 11/2012 | Li |
| 2013/0173970 | A1* | 7/2013 | Kleveland ............ G11C 29/50  714/710 |
| 2014/0146613 | A1 | 5/2014 | Yang et al. |
| 2014/0219023 | A1 | 8/2014 | Li et al. |
| 2015/0066417 | A1 | 3/2015 | Kimura |
| 2015/0178614 | A1 | 6/2015 | Lin |
| 2015/0248322 | A1 | 9/2015 | Hara et al. |
| 2016/0005452 | A1 | 1/2016 | Bae |
| 2016/0307645 | A1 | 10/2016 | Kim |
| 2016/0351276 | A1 | 12/2016 | Shim |
| 2017/0110206 | A1 | 4/2017 | Ryu et al. |
| 2017/0133108 | A1 | 5/2017 | Lee |
| 2018/0182467 | A1 | 6/2018 | Kang et al. |
| 2019/0164621 | A1 | 5/2019 | Kim |
| 2019/0237154 | A1* | 8/2019 | Choi ............ G11C 29/783 |
| 2019/0287641 | A1 | 9/2019 | Ko |
| 2019/0348100 | A1 | 11/2019 | Smith et al. |
| 2019/0348102 | A1 | 11/2019 | Smith et al. |
| 2020/0152285 | A1 | 5/2020 | Nakaoka |
| 2020/0243159 | A1* | 7/2020 | Kang ............ G06F 11/1048 |
| 2022/0058079 | A1 | 2/2022 | Chen |
| 2022/0058080 | A1 | 2/2022 | Chen |
| 2022/0059182 | A1* | 2/2022 | Chen ............ G11C 29/76 |
| 2022/0270668 | A1* | 8/2022 | Li ............ G11C 11/4096 |
| 2022/0310187 | A1* | 9/2022 | Chen ............ G11C 29/76 |
| 2022/0317908 | A1* | 10/2022 | Chen ............ G06F 3/0679 |

FOREIGN PATENT DOCUMENTS

| | | |
|---|---|---|
| CN | 1404140 A | 3/2003 |
| CN | 1409323 A | 4/2003 |
| CN | 1467746 A | 1/2004 |
| CN | 101329918 A | 12/2008 |
| CN | 101331554 A | 12/2008 |
| CN | 101630337 A | 1/2010 |
| CN | 101765889 A | 6/2010 |
| CN | 102157203 A | 8/2011 |
| CN | 101765889 B | 12/2013 |
| CN | 103473160 A | 12/2013 |
| CN | 103688247 A | 3/2014 |
| CN | 103871447 A | 6/2014 |
| CN | 105787817 A | 7/2016 |
| CN | 105989899 A | 10/2016 |
| CN | 109753374 A | 5/2019 |
| CN | 110010187 A | 7/2019 |
| CN | 110364214 A | 10/2019 |
| CN | 110556157 A | 12/2019 |
| CN | 110797071 A | 2/2020 |
| CN | 110797072 A | 2/2020 |
| CN | 110879931 A | 3/2020 |
| CN | 110968985 A | 4/2020 |
| CN | 111312321 A | 6/2020 |
| CN | 112216621 A | 1/2021 |
| CN | 112885398 A | 6/2021 |
| CN | 112908402 A | 6/2021 |
| CN | 112908403 A | 6/2021 |
| EP | 1217524 A2 | 6/2002 |
| JP | 2000048596 A | 2/2000 |
| JP | 2008084409 A | 4/2008 |
| KR | 100795520 B1 | 1/2008 |
| KR | 20160016422 A | 2/2016 |
| KR | 20190093358 A | 8/2019 |
| TW | 376558 B | 12/1999 |
| TW | 470964 B | 1/2002 |
| TW | 201110132 A | 3/2011 |
| TW | 201642273 A | 12/2016 |

OTHER PUBLICATIONS

International Search Report in the international application No. PCT/CN2021/099149, dated Sep. 7, 2021, 2 pgs.
International Search Report in the international application No. PCT/CN2021/099146, dated Sep. 7, 2021, 2 pgs.
International Search Report in the international application No. PCT/CN2021/099173, dated Aug. 26, 2021, 2 pgs.
Supplementary European Search Report in the European application No. 21773439.1, dated Jun. 27, 2022, 8 pgs.
English translation of the Written Opinion of the International Search Authority in the international application No. PCT/CN2021/099159, dated Sep. 8, 2021, 4 pgs.
English translation of the Written Opinion of the International Search Authority in the international application No. PCT/CN2021/099149, dated Sep. 7, 2021, 4 pgs.
First Office Action of the U.S. Appl. No. 17/464,886, dated Feb. 21, 2023, 32 pgs.
First Office Action of the U.S. Appl. No. 17/462,042, dated Mar. 2, 2023, 63 pgs.
English translation of the Written Opinion of the International Search Authority in the international application No. PCT/CN2021/099146, dated Sep. 7, 2021, 4 pgs.
English translation of the Written Opinion of the International Search Authority in the international application No. PCT/CN2021/099173, dated Aug. 26, 2021, 3 pgs.
First Office Action of the U.S. Appl. No. 17/445,300, dated Mar. 2, 2023, 59 pgs.
International Search Report in the international application No. PCT/CN2021/109442, dated Jan. 4, 2022, 3 pgs.
Notice of Allowance of the Chinese application No. 202110352509.2, dated Apr. 15, 2022, 7 pgs.
International Search Report in the international application No. PCT/CN2021/109515, dated Dec. 30, 2021, 2 pgs.
Notice of Allowance of the Chinese application No. 202110352499.2, dated Apr. 15, 2022, 8 pgs.
International Search Report in the international application No. PCT/CN2021/109464, dated Dec. 30, 2021, 2 pgs.
Notice of Allowance of the Chinese application No. 202110327478.5, dated Apr. 25, 2022, 7 pgs.

(56) References Cited

OTHER PUBLICATIONS

"Enhancement of Fault Collection for Embedded RAM Redundancy Analysis Considering Intersection and Orphan Faults", Mar. 2018, Stefan Kristofik and Peter Malik, Integration, The VLSI Journal, North-Holland Publication Company, vol. 62, pp. 190-204.
"On the Repair of Redundant RAM's", Mar. 1987, Chin-Long Wey and Fabrizio Lombardi, IEEE Transactions on Computer-Aided Design of Integrated Circuits and Systems, IEEE, vol. CAD-06, No. 2, pp. 222-231. XP000097484.
First Office Action of the European application No. 21773439.1, dated Feb. 24, 2023, 6 pgs.
Notice of Allowance of the U.S. Appl. No. 17/568,948, dated Aug. 30, 2023, 60 pages.
Non-Final Office Action of the U.S. Appl. No. 17/648,665, dated Aug. 28, 2023, 67 pages.
Non-Final Office Action of the U.S. Appl. No. 17/446,978, dated Aug. 21, 2023, 51 pages.
Notice of Allowance of the Chinese application No. 202010833678.3, dated Jun. 12, 2023, 4 pages with English abstract.
Notice of Allowance of the U.S. Appl. No. 17/445,300, dated Aug. 17, 2023, 65 pages.
Notice of Allowance of the Chinese application No. 202010832396.1, dated Jun. 12, 2023, 5 pages with English abstract.
Notice of Allowance of the U.S. Appl. No. 17/462,042, dated Jun. 20, 2023, 63 pages.
Notice of Allowance of the Chinese application No. 202010832380.0, dated Jun. 12, 2023, 5 pages with English abstract.

\* cited by examiner

STANDBY CIRCUIT DISPATCH METHOD, APPARATUS, DEVICE AND MEDIUM

CROSS REFERENCE TO RELATED APPLICATION(S)

The application is continuation of international application PCT/CN2021/109515, filed on Jul. 30, 2021, which claims priority to Chinese patent application No. 202110352499.2, filed on Mar. 31, 2021 and entitled "REDUNDANT CIRCUIT DISPATCH METHOD, APPARATUS, DEVICE AND MEDIUM". The contents of international application PCT/CN2021/109515 and Chinese patent application No. 202110352499.2 are hereby incorporated by reference in their entireties.

TECHNICAL FIELD

The application relates to the technical field of semiconductor, and in particular to a redundant circuit dispatch method, apparatus, device and medium.

BACKGROUND

As the technologies of semiconductor memory are rapidly developing, market has placed higher demands on memory performance and reliability of semiconductor memory devices. The number and density of memory units in the semiconductor memory device are continuously increasing, leading to continuous increases in the total number of failure bits in a semiconductor memory device and the percentage of the failure bits relative to the total number of memory units, which impact the memory performance and reliability of the semiconductor memory device.

A preset number of redundant circuits are additionally arranged in a storage array area of the semiconductor storage device in advance, address lines with failure bits are replaced with the redundant circuits, so as to repair the semiconductor storage device having the failure bits, which can effectively improve the memory performance and reliability of the semiconductor memory device.

In further improvement of the memory performance and reliability of the semiconductor memory device, it has been urgently how to determine a redundant circuit dispatch repair scheme under the condition that the number of available redundant circuits in the semiconductor memory device is known, so that the utilization efficiency of the redundant circuits is improved on the premise of ensuring that all failure bits can be repaired.

SUMMARY

A first aspect of the disclosure provides a redundant circuit dispatch method, which includes the following operations.

A first test item is executed and first test data is acquired, the first test data including position data of a failure bit acquired during execution of the first test item.

A first redundant circuit dispatch result is determined according to the first test data, the first redundant circuit dispatch result including the number of dispatched regional redundant circuits and position data corresponding to the dispatched regional redundant circuits.

A second test item is executed and second test data is acquired, the second test data including position data of a failure bit acquired during execution of the second test item.

When the failure bit acquired during execution of the second test item includes a failure bit outside a repair range of the dispatched regional redundant circuits and dispatched global redundant circuits, and the number of the dispatched regional redundant circuits is equal to the number of dispatchable regional redundant circuits, a maximum target bit number is acquired according to the first test data and the second test data, a target dispatch mode is selected according to an interval where the maximum target bit number is located, and a second redundant circuit dispatch result is determined according to the target dispatch mode.

In the redundant circuit dispatch method according to the above-mentioned embodiment, under the condition that the number of dispatchable regional redundant circuits and the number of dispatchable global redundant circuits are both known, the first test item is executed and the first test data is acquired, the first test data including position data of the failure bit acquired during execution of the first test item; then the first redundant circuit dispatch result is determined according to the first test data, the first redundant circuit dispatch result including the number of the dispatched regional redundant circuits and corresponding position data; the second test item is executed and the second test data is acquired, the second test data including position data of the failure bit acquired during execution of the second test item; and when the failure bit acquired during execution of the second test item includes the failure bit outside the repair range of the dispatched regional redundant circuits and the dispatched global redundant circuits, and the number of the dispatched regional redundant circuits is equal to the number of the dispatchable regional redundant circuits, the corresponding target dispatch mode is selected according to the condition of the maximum target bit number so as to intelligently determine the second redundant circuit dispatch result, on the premise of ensuring that all the failure bits may be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and thus the utilization efficiency of the redundant circuits is improved.

A second aspect of the disclosure provides a redundant circuit dispatch apparatus, which includes an execution module and a processing module. The execution module is configured to execute a first test item and acquire first test data, the first test data including position data of a failure bit acquired during execution of the first test item; and the execution module is further configured to execute a second test item and acquire second test data, the second test data including position data of a failure bit acquired during execution of the second test item. The processing module is configured to determine a first redundant circuit dispatch result according to the first test data, the first redundant circuit dispatch result including the number of dispatched regional redundant circuits and corresponding position data. The processing module is configured to, when the failure bit acquired during execution of the second test item includes a failure bit outside the repair range of the dispatched regional redundant circuits and dispatched global redundant circuits, and the number of the dispatched regional redundant circuits is equal to the number of dispatchable regional redundant circuits, acquire a maximum target bit number according to the first test data and the second test data, select a target dispatch mode according to an interval where the maximum target bit number is located, and determine the second redundant circuit dispatch result according to the target dispatch mode.

A third aspect of the disclosure provides a computer device, which includes a memory and a processor. The memory stores a computer program executable on the processor. The processor implements the program to implement the steps of the redundant circuit dispatch method in any of the embodiments of the disclosure.

A fourth aspect of the disclosure provides a computer-readable storage medium, having stored thereon a computer program which, when executed by a processor, implements the steps of the redundant circuit dispatch method in any of the embodiments of the disclosure.

BRIEF DESCRIPTION OF THE DRAWINGS

In order to describe the embodiments of the disclosure more clearly, the drawings required to be used in descriptions of the embodiments will be simply introduced below. Apparently, the drawings described below are only some embodiments of the disclosure, and other drawings may further be obtained by those skilled in the art according to the drawings without creative work.

DETAILED DESCRIPTION

Figure 1:
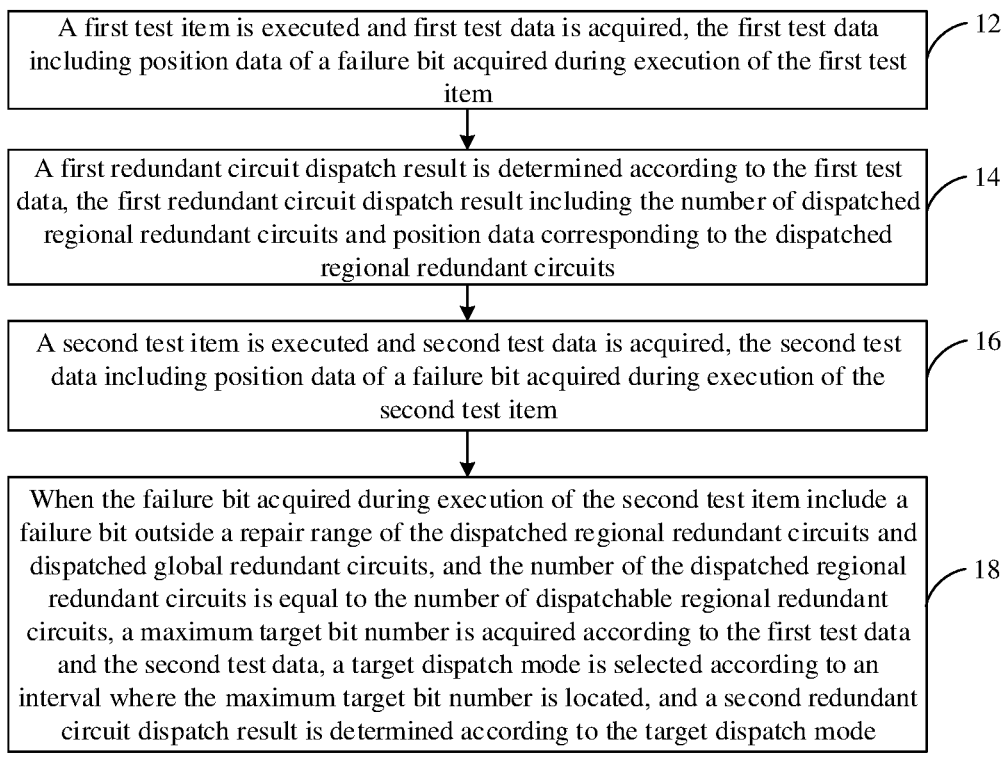
FIG. 1 is a schematic flow diagram of a redundant circuit dispatch method according to a first embodiment of the disclosure.

In order to facilitate an understanding of the disclosure, a more complete description of the disclosure will now be made with reference to the related drawings. Some embodiments of the disclosure are given in the drawings. However, the disclosure may be realized in many different forms and is not limited to the embodiments described herein. Rather, the embodiments are provided for a more thorough and complete understanding of the content of the disclosure.

Unless defined otherwise, all technical and scientific terms used herein have the same meaning as commonly understood by those skilled in the art to which this disclosure belongs. The terms used in the specification of the disclosure herein are for the purpose of describing the specific embodiments only and are not intended to be limiting of the disclosure. Where "comprising", "having" and "including" as described herein are used, another component may also be added unless explicit qualifiers such as "only," "consisting of," and the like are used. Unless mentioned to the contrary, a term in the singular may include the plural and is not to be construed as one in number.

It is to be understood that, although the terms "first", "second" and the like may be used herein to describe various elements, these elements should not be limited by these terms. These terms are only used to distinguish one element from another. For example, a first element could be called a second element, and similarly, a second element could be called a first element.

The inventive motivation and implementation principle of the disclosure are illustrated by taking the dispatch of redundant circuits to a Dynamic Random Access Memory (DRAM) chip to repair failure bits in the DRAM chip as an example. The operation of dispatching redundant circuits to the DRAM chip to repair the failure bits generally includes two types as follows.

(1) Single-Dispatch Repair Scheme

Before dispatched redundant circuits are fused to repair the failure bits in the repair range of the redundant circuits, a preset test item is performed once to acquired position data of the failure bits, and the redundant circuits are dispatched according to the acquired position data of the failure bits. Since the position data of all failure bits can be obtained only after all test items are executed, the redundant circuits are dispatched to the failure bits with known position data and a repair action is executed right after the position data of the failure bits is acquired, and it is determined whether the tested chip encounters the situation, in which dispatchable redundant circuits have been exhausted and there is an unpaired failure circuit, due to massive failure bits, resulting in that the chip quality defect cannot be found in time; moreover, before the chip with quality defect is detected, all test items have been completed, so that a lot of test time is wasted, and the chip with quality defect cannot be avoided.

(2) Discontinuous Multi-Dispatch Repair Scheme

After the preset test item is performed to acquire the position data of the failure bits each time, the redundant circuits are dispatched according to the acquired position data of the failure bits without executing the repair action; and each performing of the preset test item inherits the redundant circuit dispatch result corresponding to the previous test result, after the preset test items are operated for multiple times and the position data of all the failure bits is acquired, the repair action is executed according to the redundant circuit dispatch result corresponding to the last test result; therefore, on the premise that it is determined that all the failure bits in the tested chip may be repaired by the dispatchable redundant circuits, the repair action is executed according to the redundant circuit dispatch result corresponding to the last test result, so that the efficiency of test repair of the chip is effectively improved, and the chip with quality defect and waste of repair resources for the chip with quality defect are avoided. However, in the discontinuous multi-dispatch repair scheme, the redundant circuit dispatch results corresponding to the multiple test results are made on the premise that the position data of not all failure bits is acquired, then the situation where the failure bits are not covered by the repair range of the actually dispatched redundant circuits is likely to occur under the condition that all the failure bits may be really and completely repaired, leading to reduction in the yield of the semiconductor memory chip; in addition, the situation where the same failure bit is repeatedly repaired by different types of redundant circuits can easily occur, resulting in increased repair cost.

Therefore, the disclosure aims at providing a redundant circuit dispatch method. On the premise of ensuring that all failure bits may be repaired, the utilization efficiency of redundant circuits is improved, the situation of repeated repair is avoided, and therefore the yield of a semiconductor memory chip is improved while the repair cost is reduced.

Referring to FIG. 1, an embodiment of the disclosure provides a redundant circuit dispatch method, which includes the following operations.

At 12, a first test item is executed and first test data is acquired, the first test data including position data of a failure bit acquired during execution of the first test item.

At 14, a first redundant circuit dispatch result is determined according to the first test data, the first redundant circuit dispatch result including the number of dispatched regional redundant circuits and position data corresponding to the dispatched regional redundant circuits.

At 16, a second test item is executed and second test data is acquired, the second test data including position data of a failure bit acquired during execution of the second test item.

At 18, when the failure bit acquired during execution of the second test item include a failure bit outside a repair range of the dispatched regional redundant circuits and dispatched global redundant circuits, and the number of the dispatched regional redundant circuits is equal to the number of dispatchable regional redundant circuits, a maximum target bit number is acquired according to the first test data and the second test data, a target dispatch mode is selected according to an interval where the maximum target bit number is located, and a second redundant circuit dispatch result is determined according to the target dispatch mode.

Figure 2:
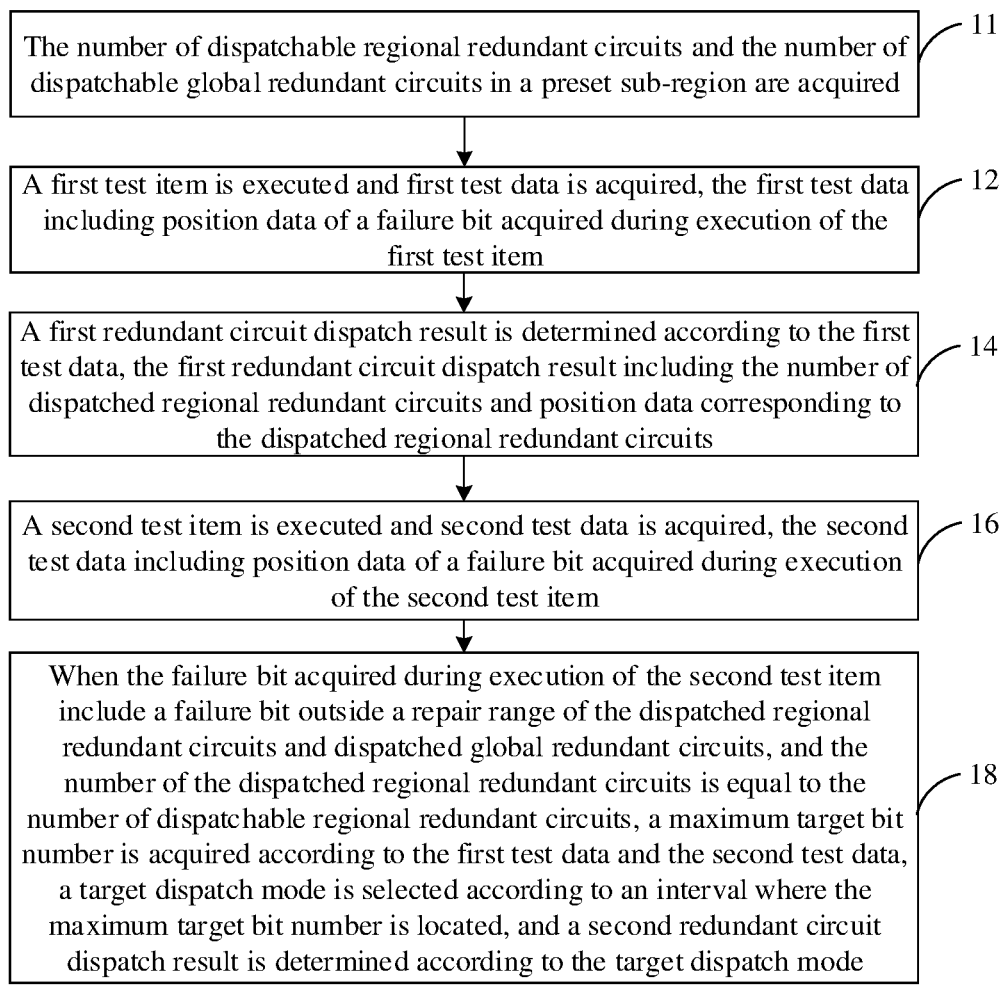
FIG. 2 is a schematic flow diagram of a redundant circuit dispatch method according to a second embodiment of the disclosure.

As an example, with continued reference to FIG. 1, under the condition that the number of dispatchable regional redundant circuits and the number of dispatchable global redundant circuits are both known, the first test item is executed, and the first test data is acquired, the first test data including position data of failure bits acquired during execution of the first test item, then the first redundant circuit dispatch result is determined according to the first test data, the first redundant circuit dispatch result including the number of the dispatched regional redundant circuits and corresponding position data; the second test item is executed, and the second test data is acquired, the second test data including position data of failure bits acquired during execution of the second test item; and when the failure bit acquired during execution of the second test item includes a failure bit outside the repair range of the dispatched regional redundant circuits and the dispatched global redundant circuits, and the number of the dispatched regional redundant circuits is equal to the number of the dispatchable regional redundant circuits, the corresponding target dispatch mode is selected according to the condition of the maximum target bit number so as to intelligently determine the second redundant circuit dispatch result. On the premise of ensuring that all the failure bits may be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and thus the utilization efficiency of the redundant circuits is improved. When the yield cannot be kept stable for a long time, the target dispatch mode is intelligently selected, so that the calculation speed is increased. Furthermore, referring to FIG. 2, in an embodiment of the disclosure, before the first test item is executed and the first test data is acquired, the method further includes the following operation.

At 11, the number of dispatchable regional redundant circuits and the number of dispatchable global redundant circuits in a preset sub-region are acquired.

By acquiring the number of dispatchable regional redundant circuits and the number of dispatchable global redundant circuits in the preset sub-region, a redundant circuit dispatch scheme is determined according to the number of the dispatchable regional redundant circuits and the number of the dispatchable global redundant circuits. On the premise of ensuring that all failure bits can be repaired by the dispatched regional redundant circuits and the dispatched global redundant circuits, the sum of the number of the dispatched regional redundant circuits and the number of the dispatched global redundant circuits is reduced as much as possible, then the situation of repeated repair is avoided, and the utilization efficiency of the redundant circuits is improved.

As an example, in an embodiment of the disclosure, the extension direction of the regional redundant circuits is consistent with the extension direction of bit lines; the extension direction of the global redundant circuits is consistent with the extension direction of word lines, so that the regional redundant circuits can repair the failure bits in the row direction in a memory unit array, and the global redundant circuits can repair the failure bits in the column direction in the memory unit array.

Figure 3:
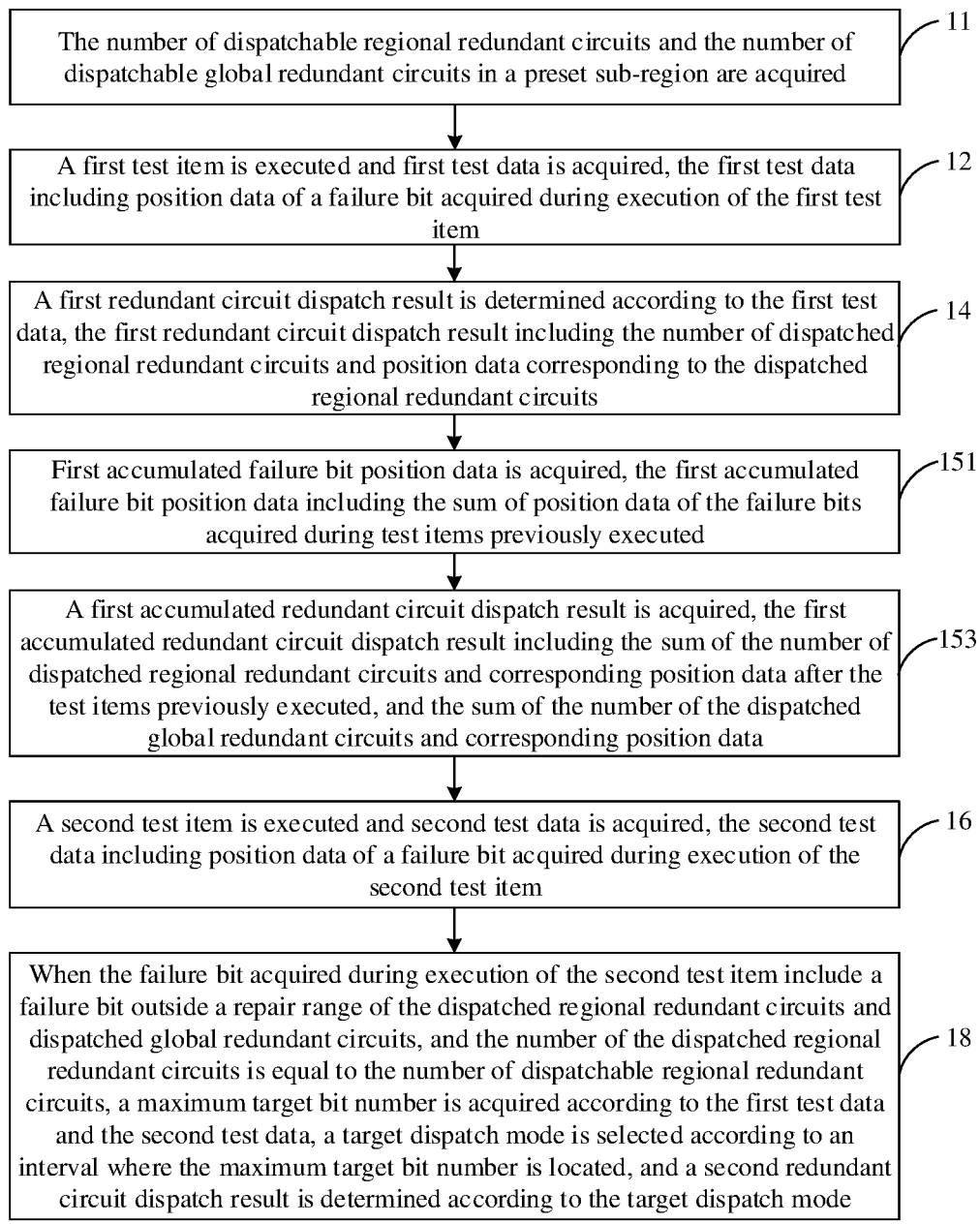
FIG. 3 is a schematic flow diagram of a redundant circuit dispatch method according to a third embodiment of the disclosure.

Furthermore, referring to FIG. 3, in an embodiment of the disclosure, after the first redundant circuit dispatch result is determined according to the first test data and before the second test item is executed and the second test data is acquired, further includes the following operations.

At 151, first accumulated failure bit position data is acquired, the first accumulated failure bit position data including the sum of position data of the failure bits acquired during test items previously executed.

At 153, a first accumulated redundant circuit dispatch result is acquired, the first accumulated redundant circuit dispatch result including the sum of the number of dispatched regional redundant circuits and corresponding position data after the test items previously executed, and the sum of the number of the dispatched global redundant circuits and corresponding position data.

As an example, with further reference to FIG. 3, by acquiring the first accumulated failure bit position data that includes the sum of position data of the failure bits acquired during execution of the test items previously executed, repeated test for the failure bits with known position data is no longer carried out during execution of the second test item, so that the execution efficiency of the test item is improved, and the position data of all failure bits is detected as much as possible; by acquiring the first accumulated redundant circuit dispatch result, which includes the sum of the number of dispatched regional redundant circuits and corresponding position data after the test items previously executed, as well as the sum of the number of dispatched global redundant circuits and corresponding position data, after each executed test item, whether the repair range of the dispatched global redundant circuits and the dispatched regional redundant circuits may cover all failure bits with known position data is judged, and whether the redundant circuit dispatch scheme can be further optimized is determined. On the premise of avoiding missing repair or repeated repair of the failure bits, the number of the dispatched regional redundant circuits and the number of the dispatched global redundant circuits are reduced as much as possible.

As an example, in an embodiment of the disclosure, after the first redundant circuit dispatch result is determined according to the first test data and before the second test item is executed and the second test data is acquired, the method further includes the following operations.

At 1521, the name of the first test item is acquired.

At 1522, a first accumulated failure bit position result is generated, the first accumulated failure bit position result including the name of the first test item and the first accumulated failure bit position data.

Specifically, the (m−1)-th accumulated failure bit position result may be generated according to the acquired name of the (m−1)-th test item, the (m−1)-th accumulated failure bit position result includes the name of the (m−1)-th test item and the (m−1)-th accumulated failure bit position data so as to obtain the m-th accumulated failure bit position data, the m-th accumulated failure bit position data being the sum of the (m−1)-th accumulated failure bit position data and the failure bit position data obtained during execution of the m-th test item; and then the m-th accumulated redundant circuit dispatch result is obtained, the m-th accumulated redundant circuit dispatch result is the sum of the (m−1)-th accumulated redundant circuit dispatch result and the m-th redundant circuit dispatch result, where m is the number of the test items to be executed, and m is an integer larger than or equal to 2. Therefore, whether the repair range of the dispatched redundant circuits completely covers all failure bits with the known position data or not is judged according to the m-th accumulated redundant circuit dispatch result. The dispatched redundant circuits may include global redundant circuits and regional redundant circuits, the extension direction of the regional redundant circuits is consistent with the extension direction of bit lines, and the extension direction of the global redundant circuits is consistent with the extension direction of word lines.

Figure 4:
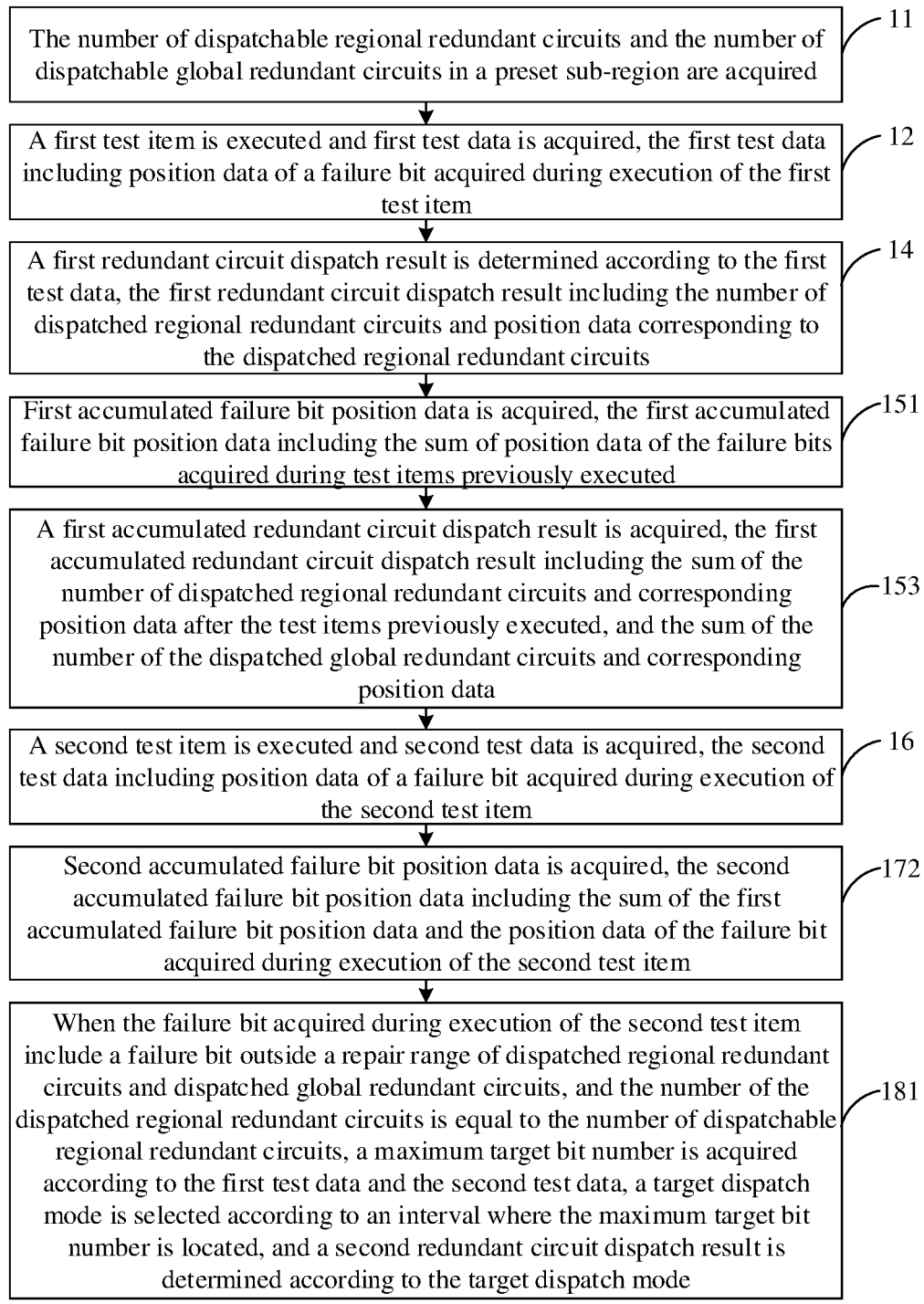
FIG. 4 is a schematic flow diagram of a redundant circuit dispatch method according to a fourth embodiment of the disclosure.

Furthermore, referring to FIG. 4, an embodiment of the disclosure provides a redundant circuit dispatch method is provided, which includes the following operations.

At 11, the number of dispatchable regional redundant circuits and the number of dispatchable global redundant circuits in a preset sub-region are acquired.

At 12, a first test item is executed and first test data is acquired, the first test data including position data of a failure bit acquired during execution of the first test item.

At 14, a first redundant circuit dispatch result is determined according to the first test data, the first redundant circuit dispatch result including the number of dispatched regional redundant circuits and position data corresponding to the dispatched regional redundant circuits.

At 151, first accumulated failure bit position data is acquired, the first accumulated failure bit position data including the sum of position data of failure bits acquired during test items previously executed.

At 153, a first accumulated redundant circuit dispatching result is acquired, the first accumulated redundant circuit dispatching result including the sum of the number of the dispatched regional redundant circuits and the corresponding position data after the test item previously executed, and the sum of the number of the dispatched global redundant circuits and the position data corresponding to the dispatched global redundant circuits.

At 16, a second test item is executed and second test data is acquired, the second test data including position data of failure bits acquired during execution of the second test item.

At 172, second accumulated failure bit position data is acquired, the second accumulated failure bit position data including the sum of the first accumulated failure bit position data and the position data of the failure bit acquired during execution of the second test item.

At 181, when the failure bit acquired during execution of the second test item include a failure bit outside a repair range of dispatched regional redundant circuits and dispatched global redundant circuits, and the number of the dispatched regional redundant circuits is equal to the number of dispatchable regional redundant circuits, a maximum target bit number is acquired according to the first test data and the second test data, a target dispatch mode is selected according to an interval where the maximum target bit number is located, and a second redundant circuit dispatch result is determined according to the target dispatch mode.

Specifically, after the second test item is executed and the second test data is acquired, the second test data including the position data of the failure bit acquired during execution of the second test item, and after the first accumulated redundant circuit dispatch result and the second test data are acquired, whether there is a failure bit outside the repair range of the dispatched regional redundant circuits and the dispatched global redundant circuit or not may be determined through comparison. In addition, second accumulated failure bit position data may be acquired, the second accumulated failure bit position data including the sum of the first accumulated failure bit position data and the position data of the failure bits acquired during execution of the second test item. When the failure bits acquired during execution of the second test item include failure bits outside the repair range of the dispatched regional redundant circuits and the dispatched global redundant circuits, and the number of the dispatched regional redundant circuits is equal to the number of dispatchable regional redundant circuits, according to the second accumulated failure bit position data, the number of failure bits contained in each word line in the same region is counted; and the maximum value of the number of the failure bits corresponding to each word line in the same region is taken as the maximum target bit number. The target dispatch mode is intelligently selected according to the maximum target bit number, therefore, on the premise of ensuring that all the failure bits can be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and the utilization efficiency of the redundant circuits is improved. When the yield cannot be kept stable for a long time, the target dispatch mode is intelligently selected, so that the calculation speed is increased.

As an example, in an embodiment of the disclosure, after the step that the second test item is executed and the second test data is acquired, the method further includes the following operations.

At 1711, the name of the second test item is acquired.

At 1712, a second accumulated failure bit position result is generated, the second accumulated failure bit position result including the name of the second test item and the second accumulated failure bit position data.

Specifically, the m-th accumulated failure bit position result may be generated according to the acquired name of the m-th test item, the m-th accumulated failure bit position result includes the name of the m-th test item and the m-th accumulated failure bit position data so as to generate an m-th accumulated failure bit position file according to the m-th accumulated failure bit position result, and the m-th accumulated failure bit position result file includes the (m−1)-th accumulated failure bit position result and the m-th accumulated failure bit position result, where m is the number of test items to be executed and is an integer greater than or equal to 2. Therefore, whether the repair range of the dispatched redundant circuits completely covers all failure bits with the known position data or not is judged according to the m-th redundant circuit dispatch result. The dispatched redundant circuits may include global redundant circuits and regional redundant circuits, the extension direction of the regional redundant circuits is consistent with the extension direction of bit lines, and the extension direction of the global redundant circuits is consistent with the extension direction of word lines.

Figure 5:
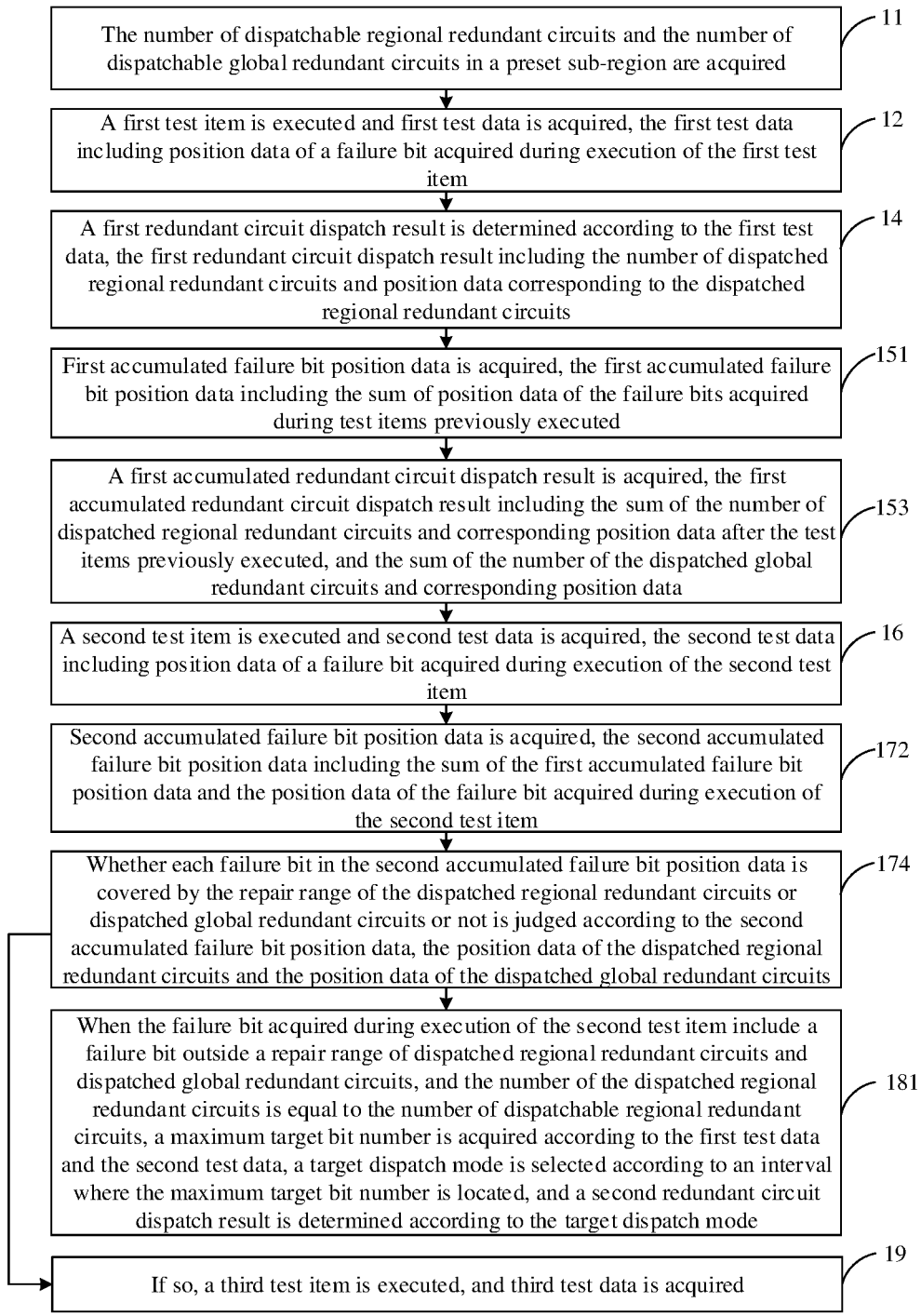
FIG. 5 is a schematic flow diagram of a redundant circuit dispatch method according to a fifth embodiment of the disclosure.

Furthermore, referring to FIG. 5, in an embodiment of the disclosure, after the second test item is executed and the second test data is acquired, the method further includes the following operations.

At 174, whether each failure bit in the second accumulated failure bit position data is covered by the repair range of the dispatched regional redundant circuits or dispatched global redundant circuits or not is judged according to the second accumulated failure bit position data, the position data of the dispatched regional redundant circuits and the position data of the dispatched global redundant circuits.

At 19, if the each failure bit in the second accumulated failure bit position data is covered by the repair range of the dispatched regional redundant circuits or dispatched global redundant circuits, a third test item is executed, and third test data is acquired.

Because the acquired position data of all the failure bits is covered by the repair range of the dispatched regional redundant circuits or the dispatched global redundant circuits, the repair action may be executed according to the redundant circuit dispatch result, so that each failure bit in the second accumulated failure bit position data is covered by the repair range of the dispatched regional redundant circuits or the dispatched global redundant circuits, and the yield of the semiconductor memory chip is effectively improved. The redundant circuit dispatch result is determined according to all failure bits with known position data, on the premise of ensuring that all the failure bits can be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and the utilization efficiency of the redundant circuits is improved.

Figure 6:
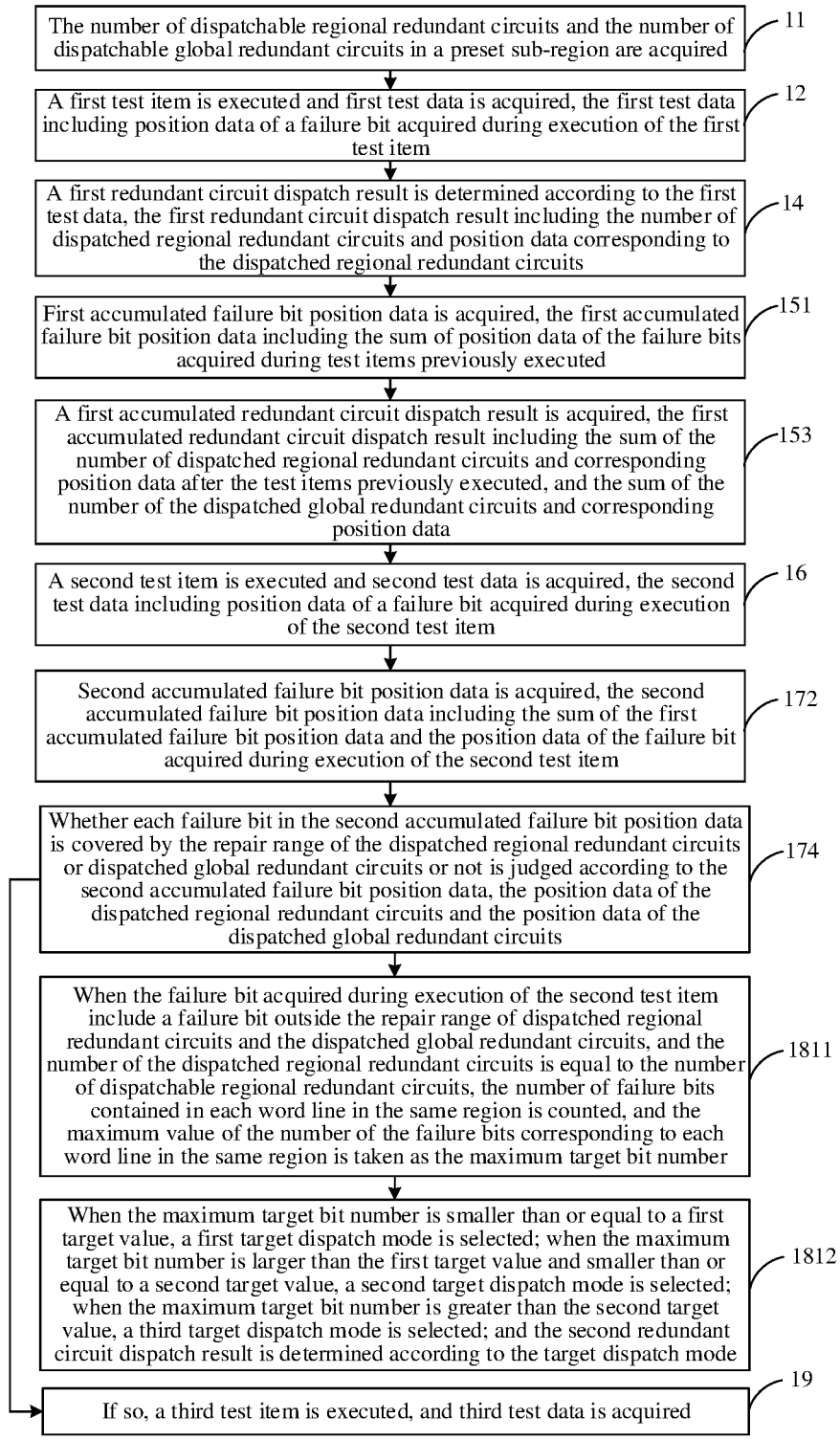
FIG. 6 is a schematic flow diagram of a redundant circuit dispatch method according to a sixth embodiment of the disclosure.

Furthermore, referring to FIG. 6, an embodiment of the disclosure differs from the embodiment shown in FIG. 5 in that the operation 181 further includes the following operations.

At 1811, when the failure bit acquired during execution of the second test item include a failure bit outside the repair range of dispatched regional redundant circuits and the dispatched global redundant circuits, and the number of the dispatched regional redundant circuits is equal to the number of dispatchable regional redundant circuits, the number of failure bits contained in each word line in the same region is counted, and the maximum value of the number of the failure bits corresponding to each word line in the same region is taken as the maximum target bit number.

At 1812, when the maximum target bit number is smaller than or equal to a first target value, a first target dispatch mode is selected; when the maximum target bit number is larger than the first target value and smaller than or equal to a second target value, a second target dispatch mode is selected; when the maximum target bit number is greater than the second target value, a third target dispatch mode is selected; and the second redundant circuit dispatch result is determined according to the target dispatch mode.

Specifically, if it is detected that there is a failure bit with the known position data located outside the repair range coverage of the dispatched regional redundant circuits or the dispatched global redundant circuits, the dispatched regional redundant circuits and the dispatched global redundant circuits in a target sub-region, a target region, or the target sub-region and an associated sub-region are withdrawn, the second redundant circuit dispatch result is determined according to the target position data of the withdrawn failure bits in the sub-region or region, therefore, the regional redundant circuits and the global redundant circuits are dispatched according to the second redundant circuit dispatch result, so that each failure bit in the second accumulated failure bit position data is covered by the repair range of the dispatched regional redundant circuits or dispatched global redundant circuits. On the premise of avoiding missing repair or repeated repair of the failure bits, the number of the dispatched regional redundant circuits and the number of the dispatched global redundant circuits are reduced as much as possible. When the yield is high and the failure bit distribution is simple distribution, withdrawing and re-dispatching are carried out on the redundant circuits in the sub-region meeting the condition; and when the yield is high and the failure bit distribution is non-complex distribution, withdrawing and re-dispatching are carried out on the redundant circuits in the region meeting the condition, so that under the condition that the operation cost for redundant circuit dispatching calculation is low, the operation cost for calculating the associated sub-region may be reduced, and the calculation speed is improved. When the yield is low and the failure bit distribution is complex distribution, withdrawing and re-dispatching are only carried out on some of the redundant circuits in the sub-region meeting the condition, so that the processing range of redundant circuit dispatch calculation may be greatly reduced, and the calculation speed is increased. Therefore, when the yield cannot be kept stable for a long time, the target dispatch mode is intelligently selected, so that the calculation speed is increased.

For example, when the maximum target bit number is smaller than or equal to 1, it is indicated that the failure bits in the region are in a simple distribution condition, and the first target dispatch mode is selected; when the maximum target bit number is larger than 1 and smaller than or equal to 2, it is indicated that the failure bits in the region belong to the non-complex distribution situation, and the second target dispatch mode is selected; and when the maximum target bit number is greater than 2, it is indicated that the failure bits in the region are in a complex distribution condition, and the third target dispatch mode is selected.

In an embodiment of the disclosure, when the target dispatch mode is the first target dispatch mode, the determination of the second redundant circuit dispatch result according to the target dispatch mode includes: the dispatched regional redundant circuits and dispatched global redundant circuits in a target sub-region are withdrawn from the first accumulated redundant circuit dispatch result, the target sub-region being the sub-region where the failure bit outside the repair range is located; and the second redundant circuit dispatch result is determined according to the first target position data of the failure bit of the target sub-region. When the target dispatch mode is the first target dispatch mode, the failure bit positions in the region are in simple distribution, any sub-region has no associated sub-region, the dispatched regional redundant circuits and the dispatched global redundant circuits in the target sub-region are withdrawn in the first target dispatch mode, redundant circuit dispatch calculation is carried out again based on the first target position data, the consumed time is short, the speed is high, and it is guaranteed that all failure bits can be repaired.

In an embodiment of the disclosure, when the target dispatch mode is the second target dispatch mode, the determination of the second redundant circuit dispatch result according to the target dispatch mode includes: the dispatched regional redundant circuits and dispatched global redundant circuits in a target region are withdrawn from the first accumulated redundant circuit dispatch result, the target region being the region where the failure bit outside the repair range is located; and the second redundant circuit dispatch result is determined according to the second target position data of the failure bit of the target region. When the target dispatch mode is the second target dispatch mode, the failure bit positions in the region are in non-complex distribution, therefore, the number of possible combinations of the redundant circuit distribution is very small, namely the operation cost is low, so that the operation cost of redundant circuit dispatch calculation is relatively low, the operation cost does not need to be wasted in calculation of the associated sub-region, the dispatched regional redundant circuits and the dispatched global redundant circuits in the target sub-region are withdrawn in the second target dispatch mode, redundant circuit dispatch calculation is carried out again based on the second target position data, the calculation efficiency is high, and it is guaranteed that all failure bits can be repaired.

In an embodiment of the disclosure, when the target dispatch mode is the third target dispatch mode, the determination of the second redundant circuit dispatch result according to the target dispatch mode includes: the dispatched regional redundant circuits and dispatched global redundant circuits in a target sub-region and the associated sub-region are withdrawn from the first accumulated redundant circuit dispatch result, the target sub-region being the sub-region where the failure bit outside the repair range is located; and the second redundant circuit dispatch result is determined according to the third target position data of the failure bit of the target sub-region and the associated sub-region. When the target dispatch mode is the third target dispatch mode, the failure bit positions in the region are in complex distribution, therefore, the number of possible combinations of the redundant circuit distribution is very small, namely the operation cost is high, therefore, the operation cost of redundant circuit dispatch calculation is relatively high, the operation range of redundant circuit dispatching calculation needs to be reduced as much as possible, the dispatched regional redundant circuits and the dispatched global redundant circuits in the target sub-region and the associated sub-region are withdrawn in the third target dispatch mode, redundant circuit dispatch calculation is carried out again based on the third target position data, the calculation cost can be reduced, and it is guaranteed that all failure bits can be repaired.

Furthermore, in an embodiment of the disclosure, when the target dispatch mode is the third target dispatch mode, the method further includes: associated failure bits of the failure bits outside the repair range of the dispatched regional redundant circuits and the dispatched global redundant circuits and an associated sub-region where the associated failure bit is located are searched according to the first redundant circuit dispatching accumulated result and the second test data; the associated failure bit is a failure bit which is located in the same region and in the same word line as the failure bit outside the repair range; third target position data of failure bit in the target sub-region and the associated sub-region are acquired according to the first accumulated failure bit position data and the second test data; and the second redundant circuit dispatch result is determined according to the third target position data.

Figure 7A:
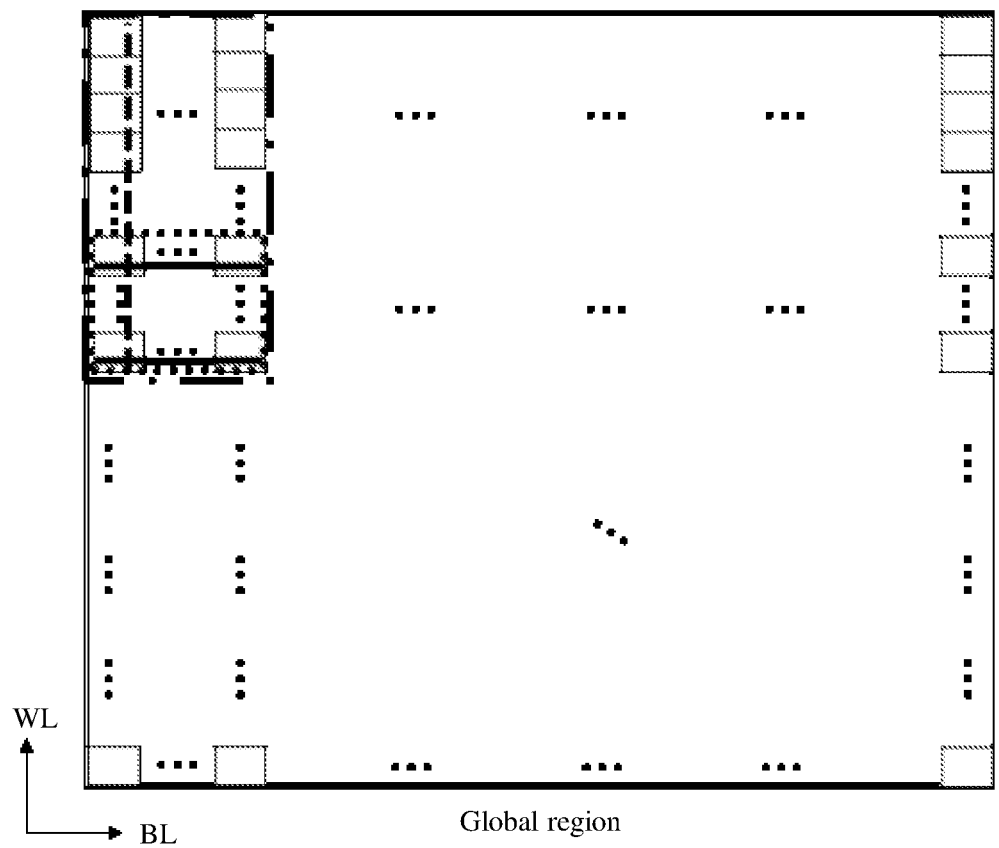
FIGS. 7A-7D are schematic diagrams illustrating division of memory unit array region of a memory according to an embodiment of the disclosure.
Figure 7B:
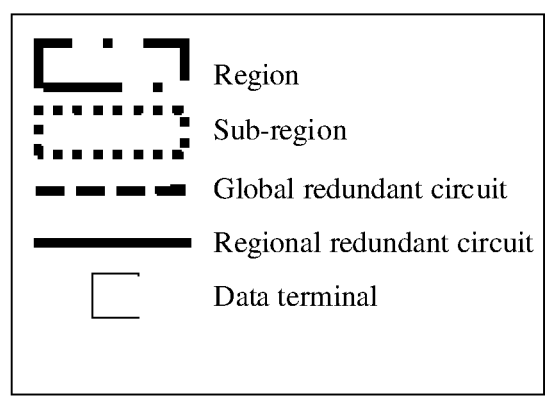

As an example, referring to FIGS. 7A and 7B, in an embodiment of the disclosure, before the number of dispatchable regional redundant circuits and the number of dispatchable global redundant circuits in a preset sub-region are acquired, the method further includes: a memory unit array region of the memory is divided into a plurality of global regions; any of the global regions is divided into a plurality of regions; any of the regions is divided into a plurality of sub-regions; the dispatchable global redundant circuits in any region are not crossed with the dispatchable global redundant circuits in other regions in the same global region; and the dispatchable regional redundant circuits in any sub-region are not crossed with the dispatchable regional redundant circuits in other sub-regions in the same region.

The memory unit array region of the memory is divided into a plurality of global regions as shown in FIG. 7A, and then any global region shown in FIG. 7A is divided into a plurality of regions by referring to the region range, the sub-region range, the global redundant circuit coverage range and the regional redundant circuit coverage range as shown in FIG. 7B; any of the regions is divided into a plurality of sub-regions; the dispatchable global redundant circuits in any region are not crossed with the dispatchable global redundant circuits in other regions in the same global region; and the dispatchable regional redundant circuits in any sub-region are not crossed with the dispatchable regional redundant circuits in other sub-regions in the same region, the extension direction of each regional redundant circuit is consistent with the extension direction BL of bit lines, and the extension direction of each global redundant circuit is consistent with the extension direction WL of word lines. Therefore, the redundant circuit dispatch method according to the embodiment of the disclosure is realized. On the premise of ensuring that all the failure bits may be repaired, the utilization efficiency of redundant circuits is improved, the situation of repeated repair is avoided, the repair cost is reduced, and meanwhile, the yield of the semiconductor memory chip is improved.

Figure 7C:
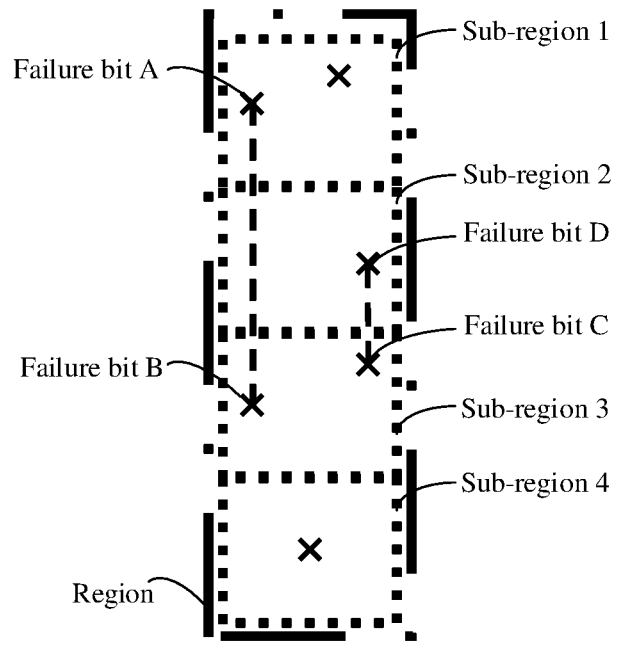

As an example, referring to FIG. 7C, in an embodiment of the disclosure, a region includes four sub-regions, namely, a sub-region 1, a sub-region 2, a sub-region 3, and a sub-region 4; the sub-region 1 and the sub-region 3 are associated sub-regions because the sub-region 1 and sub-region 3 include a failure bit A and a failure bit B in the same word line, and the sub-region 2 and the sub-region 3 are associated sub-regions because the sub-region 2 and the sub-region 3 include a failure bit D and a failure bits C which are located in the same word line. When the failure bit out of the repair range is the failure bit A which is located in the sub-region 1 and is located in the same word line as the failure bit B in the sub-region 3, the sub-region 1 is the target sub-region and the sub-region 3 is an associated sub-region, the dispatched regional redundant circuits and dispatched global redundant circuits in the sub-region 1 and the sub-region 3 are withdrawn, and position data of all failure bits contained in the sub-region 1 and the sub-region 3 are acquired as target position data, and the second redundant circuit dispatch result is determined according to the target position data.

As an example, in one embodiment of the disclosure, it is understood that in the same region, if the sub-region 1 and the sub-region 3 are associated sub-regions and the sub-region 2 and the sub-region 3 are associated sub-regions, then the sub-region 1 and the sub-region 2 are associated sub-regions. When the failure bit out of the repair range is the failure bit A which is located in the sub-region 1 and is located in the same word line as the failure bit B in the sub-region 3, the sub-region 1 is a target sub-region, and the sub-region 2 and sub-region 3 are associated sub-regions, the dispatched regional redundant circuits and the dispatched global redundant circuits in the sub-region 1, the sub-region 2 and the sub-region 3 are withdrawn, position data of all failure bits contained in the sub-region 1, the sub-region 2 and the sub-region 3 are acquired as target position data, and the second redundant circuit dispatch result is determined according to the target position data.

Figure 7D:
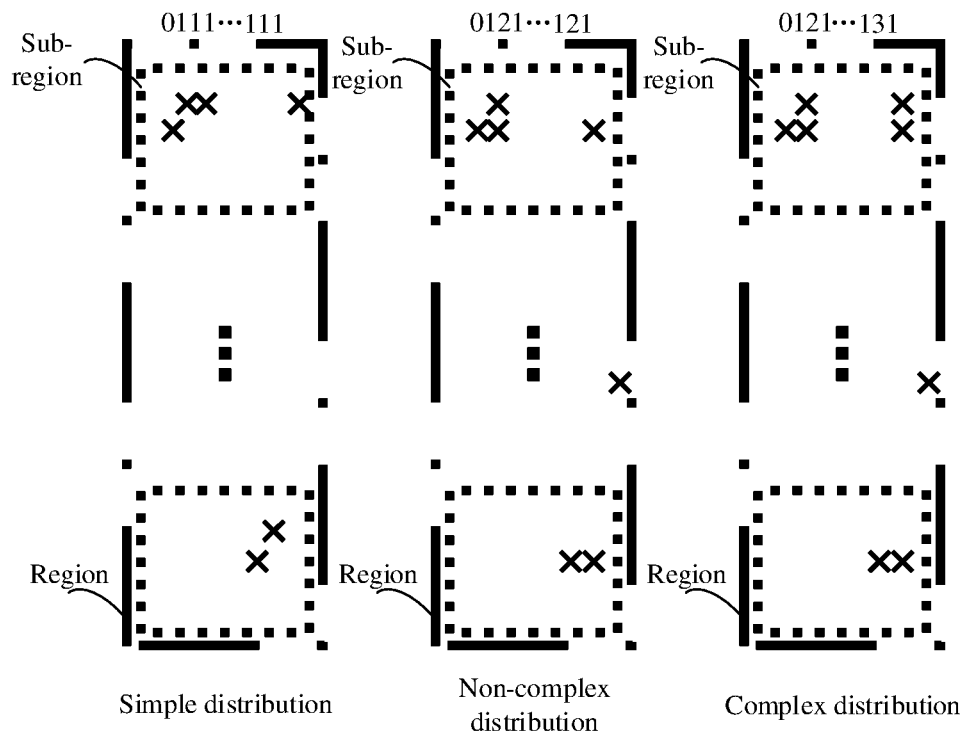

As an example, referring to FIG. 7D, in an embodiment of the disclosure, the target dispatch mode may be classified into a first target dispatch mode, a second target dispatch mode, and a third target dispatch mode. The first target dispatch mode is suitable for the condition that the failure bits in the region are in simple distribution, for example, when the maximum value of the number of the failure bits corresponding to each word line in the same region is smaller than or equal to 1, namely, the maximum target bit number is smaller than or equal to 1. The second target dispatch mode is suitable for the condition that the failure bits in the region are in non-complex distribution, for example, when the maximum value of the number of the failure bits corresponding to each word line in the same region is greater than 1 and smaller than or equal to 2, namely, the maximum target bit number is greater than 1 and smaller than or equal to 2. The third target dispatch mode is suitable for the condition that the failure bits in the region are in complex distribution, for example, when the maximum value of the number of the failure bits corresponding to each word line in the same region is greater than 2, namely, the maximum target bit number is greater than 2. As an example, in an embodiment of the disclosure, the first test item includes a detection item for electrical performance parameters; the second test item includes a detection item for electrical performance parameters; and electrical performance parameters include at least one of surface resistance, surface resistivity, volume resistance, volume resistivity or breakdown voltage.

It should be understood that while various steps in the flowcharts of FIGS. 1 to 6 are shown in sequence as indicated by arrows, the steps are not necessarily performed in sequence as indicated by arrows. Unless specified herein, the execution of the steps is not strictly limited in sequence and the steps may be executed in other sequences. Moreover, although at least a portion of the steps in FIGS. 1 to 6 may include multiple sub-steps or multiple stages, the sub-steps or stages need not necessarily be performed at the same time but may be performed at different times, and the sub-steps or stages may not necessarily be performed sequentially, rather, they may be performed in turn or in alternation with at least a portion of other steps or sub-steps or stages of other steps.

Figure 8:
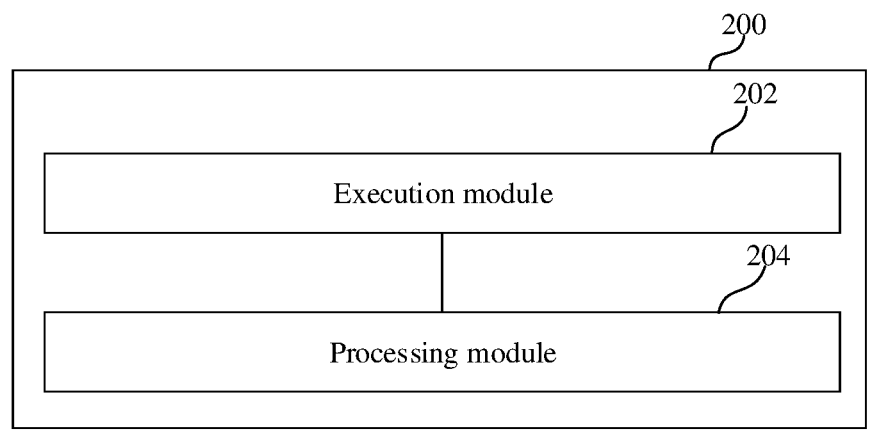
FIG. 8 is a structure diagram of a redundant circuit dispatch apparatus according to an embodiment of the disclosure.

Furthermore, referring to FIG. 8, an embodiment of the disclosure provides a redundant circuit dispatch apparatus 200, which includes an execution module 202 and a processing module 204. The execution module 202 is configured to execute a first test item and acquire first test data, the first test data including position data of a failure bit acquired during execution of the first test item; and the execution module is further configured to execute a second test item and acquire second test data, the second test data includes position data of a failure bit acquired during execution of the second test item. The processing module 204 is configured to determine a first redundant circuit dispatch result according to the first test data, the first redundant circuit dispatch result including the number of dispatched regional redundant circuits and position data corresponding to the dispatched regional redundant circuits. The processor is configured to, when the failure bits acquired during execution of the second test item include a failure bit outside the repair range of the dispatched regional redundant circuits and dispatched global redundant circuits, and the number of the dispatched regional redundant circuits is equal to the number of dispatchable regional redundant circuits, acquire a maximum target bit number according to the first test data and the second test data, select a target dispatch mode according to an interval where the maximum target bit number is located, and determine the second redundant circuit dispatch result according to the first test data, the second test data and the target dispatch mode. As an example, with continued reference to FIG. 8, under the condition that the number of dispatchable regional redundant circuits and the number of dispatchable global redundant circuits are both known, the execution module 202 is used for executing the first test item and acquire the first test data, the first test data including position data of a failure bit acquired during execution of the first test item; then a first redundant circuit dispatch result is determined according to the first test data, the first redundant circuit dispatch result including the number of dispatched regional redundant circuits and position data corresponding to the dispatched regional redundant circuits; the execution module 202 is used for executing the second test item and acquire the second test data, the second test data including position data of a failure bit acquired during execution of the second test item; and when the failure bit acquired during execution of the second test item include a failure bit outside the repair range of the dispatched regional redundant circuits and the dispatched global redundant circuits, and the number of the dispatched regional redundant circuits is equal to the number of the dispatchable regional redundant circuits, the processing module 204 is used to select the corresponding target dispatch mode according to the condition of the maximum target bit number so as to intelligently determine the second redundant circuit dispatch result, on the premise of ensuring that all the failure bits may be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and thus the utilization efficiency of the redundant circuits is improved.

Figure 9A:
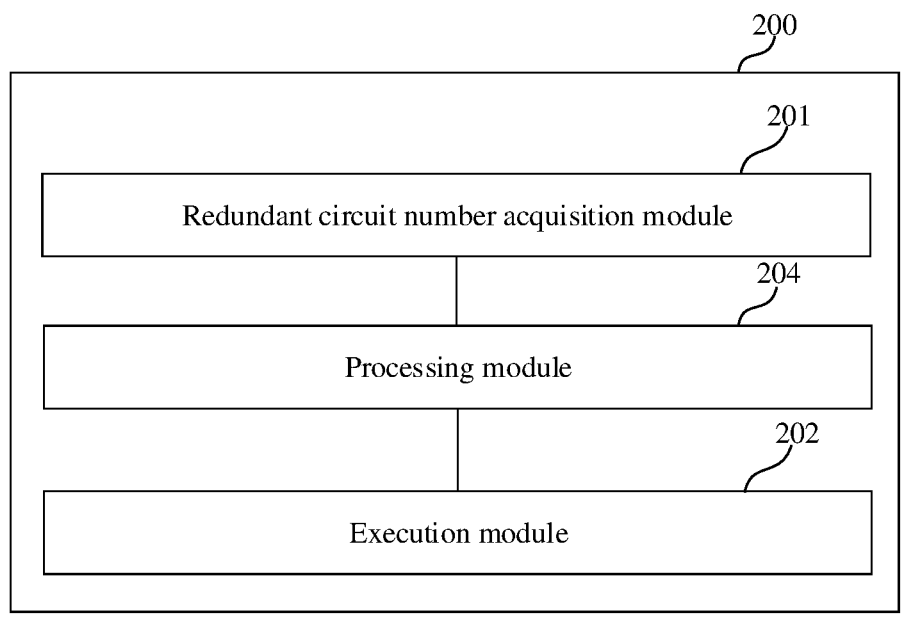
FIGS. 9A and 9B are a schematic diagram and a schematic workflow diagram of a redundant circuit dispatch apparatus according to another embodiment of the disclosure.

Furthermore, referring to FIG. 9A, in an embodiment of the disclosure, the redundant circuit dispatch apparatus 200 further includes a redundant circuit number acquisition module 201, which is configured to acquire the number of dispatchable regional redundant circuits and the number of dispatchable global redundant circuits in a preset sub-region. Therefore, a redundant circuit dispatch scheme is determined according to the number of the dispatchable regional redundant circuits and the number of dispatchable global redundant circuits. On the premise of ensuring that all failure bits may be repaired by the dispatched regional redundant circuits and the dispatched global redundant circuits, the sum of the number of the dispatched regional redundant circuits and the number of the dispatched global redundant circuits is reduced as much as possible, the situation of repeated repair is avoided, and thus the utilization efficiency of the redundant circuits is improved.

Figure 9B:
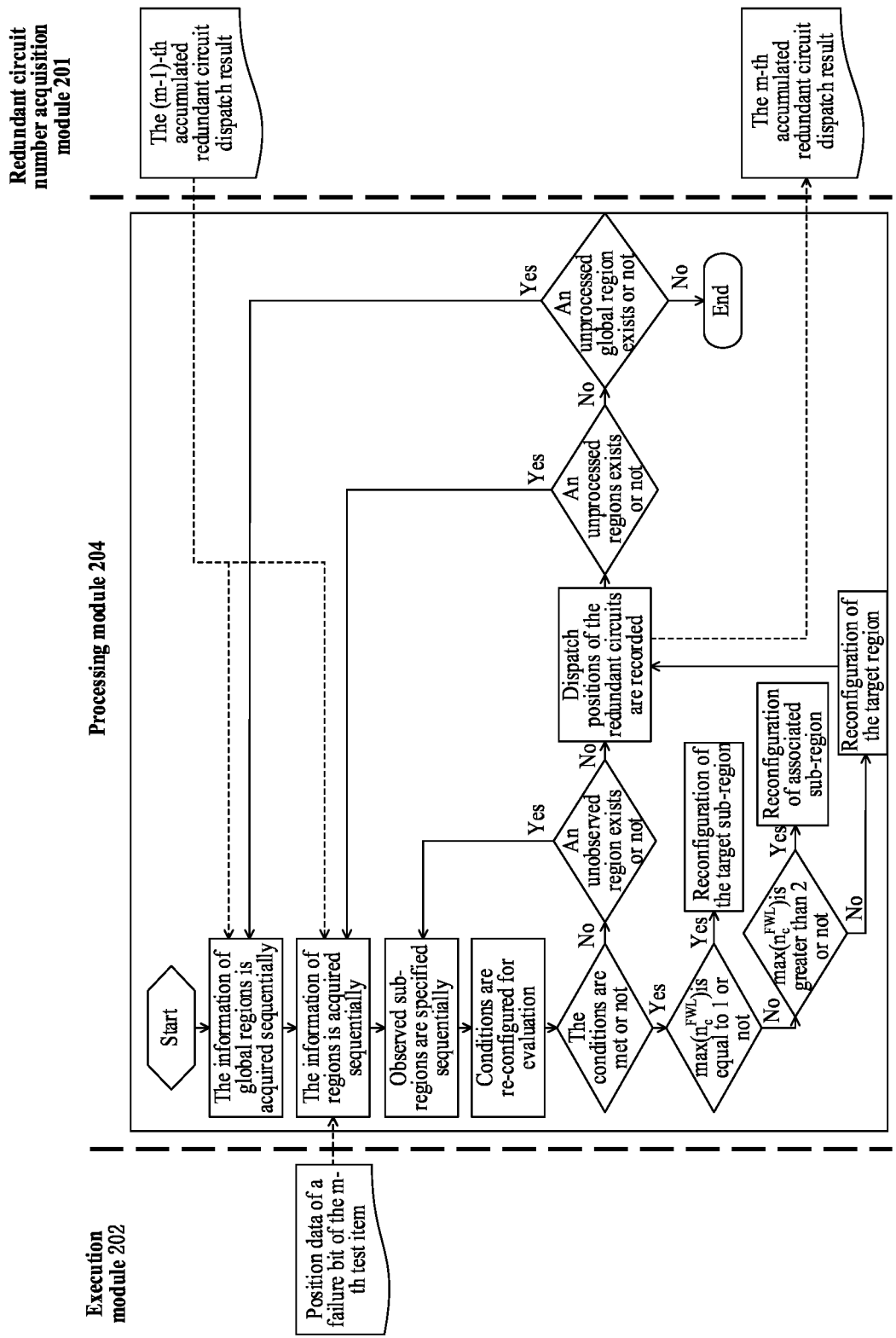

As an example, in an embodiment of the disclosure, a workflow diagram of the redundant circuit number acquisition module 201, the execution module 202 and the processing module 204 is shown in FIG. 9b. A processed global region is specified in all of the global regions of the memory chip, and the dispatched regional redundant circuits and the dispatched global redundant circuits in the global region are acquired based on the (m−1)-th accumulated redundant circuit dispatch result. In the specified processed global region, processed regions are specified in turn from all regions, position data of all failure bits in each specified processed region is acquired from the position data of the failure bits of the m-th test item, and the dispatched regional redundant circuits and the dispatched global redundant circuits in each region may be obtained through the (m−1)-th accumulated redundant circuit dispatch result. In the specified processed region, the observed sub-regions are specified in turn from all the sub-regions. Whether the observed sub-regions meet the condition or not is evaluated, namely, the condition that whether the failure bits acquired during execution of the second test item include failure bits outside the repair range of dispatched regional redundant circuits and dispatched global redundant circuits, and the number of the dispatched regional redundant circuits is equal to the number of dispatchable regional redundant circuits, if the condition is met, the sub-region is a target sub-region. When the maximum target bit number $\max(n_c^{FWL})$ is equal to 1, withdrawing and reconfiguration are carried out on the dispatched regional redundant circuits and the dispatched global redundant circuits in the target sub-region in the (m−1)-th accumulated redundant circuit dispatch result, namely, the m-th redundant circuit dispatch result is determined according to the first target position data of the failure bits of the target sub-region. When the maximum target bit number $\max(n_c^{FWL})$ is equal to 2, withdrawing and reconfiguration are carried out on the dispatched regional redundant circuits and the dispatched global redundant circuits in the target region in the (m−1)-th accumulated redundant circuit dispatch result, namely, the m-th redundant circuit dispatch result is determined according to the second target position data of the failure bits of the target region. When the maximum target bit number $\max(n_c^{FWL})$ is equal to 2, withdrawing and reconfiguration are carried out on the dispatched regional redundant circuits and the dispatched global redundant circuits in the target sub-region and the associated sub-region in the (m−1)-th accumulated redundant circuit dispatch result, namely, the m-th redundant circuit dispatch result is determined according to the third target position data of the failure bits in the target region and the associated sub-region. The m-th redundant circuit dispatch result is combined with the (m−1)-th accumulated redundant circuit dispatch result after the withdrawing operation to obtain the m-th accumulated redundant circuit dispatch result.

As an example, in an embodiment of the disclosure, the extension direction of the regional redundant circuits is consistent with the extension direction of bit lines, the extension direction of the global redundant circuits is consistent with the extension direction of word lines, so that the regional redundant circuits can repair the failure bits in the row direction in the memory unit array, and the global redundant circuits can repair the failure bits in the column direction in the memory unit array.

The various modules in the redundant circuit dispatch apparatus described above may be implemented in whole or in part by software, hardware or a combination thereof. The modules may be embedded in or independent of a processor in computer device in a hardware form, and may also be stored in a memory in the computer device in a software form, so that the processor may call and execute operations corresponding to the modules.

Figure 10:
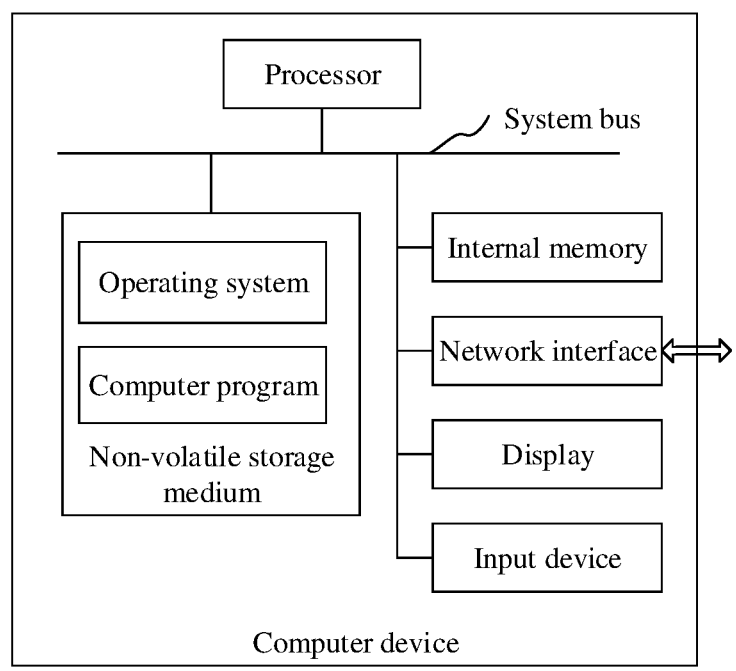
FIG. 10 is a structural schematic diagram of a computer device according to an embodiment of the disclosure.

Furthermore, an embodiment of the disclosure provides a computer device, which may be a terminal. The internal structural diagram of the computer device may be as shown in FIG. 10. The computer device includes a processor, a memory, a network interface, a display screen and an input device which are connected through a system bus. The processor of the computer device is configured to provide computation and control capabilities. The memory of the computer device includes a non-volatile storage medium, and an internal memory. The non-volatile storage medium stores an operating system and a computer program. The computer program, when executed by the processor, implements the redundant circuit dispatch method. The display screen of the computer device may be a liquid crystal display screen or an electronic ink display screen, and the input device of the computer device may be a touch layer covering the display screen, may also be a key, a trackball or a touchpad arranged on a shell of the computer device, and may also be an external keyboard, a trackpad or a mouse and the like.

Those skilled in the art will appreciate that the structure shown in FIG. 10 is merely a block diagram of a portion of the structure associated with the disclosure and does not constitute a limitation of the computer device to which the disclosure is applied, and that the particular computer device may include more or fewer components than shown, or combine certain components, or have a different arrangement of components.

In an embodiment of the disclosure, there is provided a computer-readable storage medium having stored thereon a computer program which, when executed by a processor, implements the steps of the redundant circuit dispatch method as described in any one of the embodiments of the disclosure.

Those of ordinary skill in the art will appreciate that implementing all or part of the processes in the methods described above may be accomplished by instructing associated hardware by a computer program, which may be stored in a non-volatile computer-readable storage medium, which, when executed, processes may be included as embodiments of the methods described above. Any reference to memory, storage, database, or other medium used in the various embodiments provided herein may include non-volatile and/or volatile memory. Nonvolatile memory may include Read Only Memory (ROM), Programmable ROM (PROM), Electrically Programmable ROM (EPROM), Electrically Erasable Programmable ROM (EEPROM), or flash memory. Volatile memory may include Random Access Memory (RAM) or external cache memory. By way of illustration and not limitation, RAM is available in many forms such as Static RAM (SRAM), Dynamic RAM (DRAM), Synchronous DRAM (SDRAM), Double Data Rate SDRAM (DDRSDRAM), Enhanced SDRAM (ESDRAM), Synchlink DRAM (SLDRAM), Rambus direct RAM (RDRAM), Direct Rambus Dynamic RAM (DRDRAM), and Rambus Dynamic RAM (RDRAM), among others.

The technical features of the above-described embodiments may be randomly combined, and not all possible combinations of the technical features in the above-described embodiments are described for simplicity of description.

The embodiments described above represent only several implementation modes of the disclosure, and the description thereof is specific and detailed.

What is claimed is:

1. A standby circuit dispatch method, comprising
executing a first test item and acquiring first test data, wherein the first test data comprises position data of a failure bit acquired during execution of the first test item;
determining a first redundant circuit dispatch result according to the first test data, wherein the first redundant circuit dispatch result comprises a number of dispatched regional redundant circuits and position data corresponding to the dispatched regional redundant circuits;
executing a second test item and acquiring second test data, wherein the second test data comprises position data of a failure bit acquired during execution of the second test item; and
in a case where the failure bit acquired during execution of the second test item comprises a failure bit outside a repair range of the dispatched regional redundant circuits and dispatched global redundant circuits, and the number of the dispatched regional redundant circuits is equal to a number of dispatchable regional redundant circuits, acquiring a maximum target bit number according to the first test data and the second test data, selecting a target dispatch mode according to an interval where the maximum target bit number is located, and determining a second redundant circuit dispatch result according to the target dispatch mode.

2. The standby circuit dispatch method of claim 1, before executing the first test item and acquiring the first test data, further comprising:
acquiring a number of dispatchable regional redundant circuits and a number of dispatchable global redundant circuits in a preset sub-region.

3. The standby circuit dispatch method of claim 2, wherein
an extension direction of the regional redundant circuits is consistent with an extension direction of bit lines;
an extension direction of the global redundant circuits is consistent with an extension direction of word lines.

4. The standby circuit dispatch method of claim 2, after determining the first redundant circuit dispatch result according to the first test data and before executing the second test item and acquiring the second test data, further comprising:
acquiring first accumulated failure bit position data, wherein the first accumulated failure bit position data comprises a sum of position data of failure bits acquired during test items previously executed; and
acquiring a first accumulated redundant circuit dispatch result, wherein the first accumulated redundant circuit dispatch result comprises a sum of the number of dispatched regional redundant circuits after the test items previously executed and the position data corresponding to the dispatched regional redundant circuits, and a sum of the number of the dispatched global redundant circuits and position data corresponding to the dispatched global redundant circuits.

5. The standby circuit dispatch method of claim 4, after determining the first redundant circuit dispatch result according to the first test data and before executing the second test item and acquiring the second test data, further comprising:
acquiring a name of the first test item; and
generating a first accumulated failure bit position result, wherein the first accumulated failure bit position result comprises the name of the first test item and the first accumulated failure bit position data.

6. The standby circuit dispatch method of claim 4, before executing the second test item and acquiring the second test data, further comprising:
acquiring second accumulated failure bit position data, wherein the second accumulated failure bit position data is a sum of the first accumulated failure bit position data and position data of a failure bit acquired during execution of the second test item;
wherein determining the second redundant circuit dispatch result according to the first test data and the second test data comprises:
determining the second redundant circuit dispatch result according to the second accumulated failure bit position data.

7. The standby circuit dispatch method of claim 6, wherein acquiring the maximum target bit number according to first test data and second test data comprises:
counting the number of failure bits contained in each word line in a same region according to the second accumulated failure bit position data; and
taking a maximum value of the number of failure bits corresponding to word lines in the same region as the maximum target bit number.

8. The standby circuit dispatch method of claim 7, wherein selecting the target dispatch mode according to the interval where the maximum target bit number is located comprises:
in a case where the maximum target bit number is smaller than or equal to a first target value, selecting a first target dispatch mode;
in a case where the maximum target bit number is greater than the first target value and smaller than or equal to a second target value, selecting a second target dispatch mode; and
in a case where the maximum target bit number is greater than the second target value, selecting a third target dispatch mode.

9. The standby circuit dispatch method of claim 8, wherein in a case where the target dispatch mode is the first target dispatch mode, determining the second redundant circuit dispatch result according to the target dispatch mode comprises:
withdrawing dispatched regional redundant circuits and dispatched global redundant circuits in a target sub-region from the first accumulated redundant circuit dispatch result, wherein the target sub-region is a sub-region where the failure bit outside the repair range is located; and
determining the second redundant circuit dispatch result according to first target position data of the failure bit of the target sub-region.

10. The standby circuit dispatch method of claim 8, wherein in a case where the target dispatch mode is the second target dispatch mode, determining the second redundant circuit dispatch result according to the target dispatch mode comprises:
- withdrawing dispatched regional redundant circuits and dispatched global redundant circuits in a target region from the first accumulated redundant circuit dispatch result, wherein the target region is a region where the failure bit outside the repair range is located; and
- determining the second redundant circuit dispatch result according to second target position data of the failure bit of the target region.

11. The standby circuit dispatch method of claim 8, wherein in a case where the target dispatch mode is the third target dispatch mode, determining the second redundant circuit dispatch result according to the target dispatch mode comprises:
- withdrawing dispatched regional redundant circuits and dispatched global redundant circuits in a target sub-region and an associated sub-region from the first accumulated redundant circuit dispatch result, wherein the target sub-region is a sub-region where the failure bit outside the repair range is located; and
- determining the second redundant circuit dispatch result according to third target position data of the failure bit of the target sub-region and the associated sub-region.

12. The standby circuit dispatch method of claim 11, after executing the second test item and acquiring the second test data, further comprising:
- searching for an associated failure bit of the failure bit outside the repair range of the dispatched regional redundant circuits and the dispatched global redundant circuits and an associated sub-region where the associated failure bit is located according to the first accumulated redundant circuit dispatch result and the second test data, wherein the associated failure bit is a failure bit which is located in the same region and in the same word line as the failure bit outside the repair range:
- acquiring third target position data of the failure bit in the target sub-region and the associated sub-region according to the first accumulated failure bit position data and the second test data; and
- determining the second redundant circuit dispatch result according to the third target position data.

13. The standby circuit dispatch method of claim 6, after executing the second test item and acquiring the second test data, further comprising:
- acquiring a name of the second test item; and
- generating a second accumulated failure bit position result, wherein the second accumulated failure bit position result comprises the name of the second test item and the second accumulated failure bit position data.

14. The standby circuit dispatch method of claim 6, after executing the second test item and acquiring the second test data, further comprising:
- judging whether each failure bit in the second accumulated failure bit position data is covered by the repair range of the dispatched regional redundant circuits or dispatched global redundant circuits or not according to the second accumulated failure bit position data, position data of the dispatched regional redundant circuits and position data of the dispatched global redundant circuits; and
- in response to judging that the each failure bit in the second accumulated failure bit position data is covered by the repair range of the dispatched regional redundant circuits or dispatched global redundant circuits, executing a third test item and acquiring third test data.

15. The standby circuit dispatch method of claim 6, wherein determining the second redundant circuit dispatch result according to the target dispatch mode further comprises:
- dispatching regional redundant circuits and the global redundant circuits according to the second redundant circuit dispatch result, so that each failure bit in the second accumulated failure bit position data is covered by the repair range of the dispatched regional redundant circuits or dispatched global redundant circuits.

16. The standby circuit dispatch method of claim 2, before acquiring the number of dispatchable regional redundant circuits and the number of dispatchable global redundant circuits in the preset sub-region, further comprising:
- dividing a memory unit array region of memory into a plurality of global regions;
- dividing any of the global regions into a plurality of regions; and
- dividing any of the regions into a plurality of sub-regions;
wherein dispatchable global redundant circuits in any region are not crossed with dispatchable global redundant circuits in other regions in the same global region; and dispatchable regional redundant circuits in any sub-region are not crossed with dispatchable regional redundant circuits in other sub-regions in the same region.

17. The standby circuit dispatch method of claim 1, wherein the first test item comprises a detection item for electrical performance parameters;
- the second test item comprises a detection item for electrical performance parameters;
- wherein electrical performance parameters comprise at least one of surface resistance, surface resistivity, volume resistance, volume resistivity or breakdown voltage.

18. A computer device, comprising a memory and a processor, wherein the memory stores a computer program executable on the processor, wherein the processor executes the computer program to:
- execute a first test item and acquiring first test data, wherein the first test data comprises position data of a failure bit acquired during execution of the first test item;
- determine a first redundant circuit dispatch result according to the first test data, wherein the first redundant circuit dispatch result comprises a number of dispatched regional redundant circuits and position data corresponding to the dispatched regional redundant circuits;
- execute a second test item and acquiring second test data, wherein the second test data comprises position data of a failure bit acquired during execution of the second test item; and
- in a case where the failure bit acquired during execution of the second test item comprises a failure bit outside a repair range of the dispatched regional redundant circuits and dispatched global redundant circuits, and the number of the dispatched regional redundant circuits is equal to a number of dispatchable regional redundant circuits, acquire a maximum target bit number according to the first test data and the second test data, select a target dispatch mode according to an interval where the maximum target bit number is located, and determine a second redundant circuit dispatch result according to the target dispatch mode.

19. A non-volatile computer-readable storage medium, having stored thereon a computer program which, when executed by a processor, causes the processor to:
- execute a first test item and acquiring first test data, wherein the first test data comprises position data of a failure bit acquired during execution of the first test item;
- determine a first redundant circuit dispatch result according to the first test data, wherein the first redundant circuit dispatch result comprises a number of dispatched regional redundant circuits and position data corresponding to the dispatched regional redundant circuits;
- execute a second test item and acquiring second test data, wherein the second test data comprises position data of a failure bit acquired during execution of the second test item; and
- in a case where the failure bit acquired during execution of the second test item comprises a failure bit outside a repair range of the dispatched regional redundant circuits and dispatched global redundant circuits, and the number of the dispatched regional redundant circuits is equal to a number of dispatchable regional redundant circuits, acquire a maximum target bit number according to the first test data and the second test data, select a target dispatch mode according to an interval where the maximum target bit number is located, and determine a second redundant circuit dispatch result according to the target dispatch mode.

* * * * *